United States Patent
Kijima et al.

(10) Patent No.: US 9,976,219 B2
(45) Date of Patent: May 22, 2018

(54) ELECTRODE, FERROELECTRIC CERAMICS AND MANUFACTURING METHOD THEREOF

(71) Applicant: YOUTEC CO., LTD., Chiba (JP)

(72) Inventors: Takeshi Kijima, Chiba (JP); Yuuji Honda, Chiba (JP); Koichi Furuyama, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 60 days.

(21) Appl. No.: 14/620,470

(22) Filed: Feb. 12, 2015

(65) Prior Publication Data

US 2015/0232346 A1  Aug. 20, 2015

(30) Foreign Application Priority Data

Feb. 18, 2014 (JP) .................. 2014-028922

(51) Int. Cl.

| | | |
|---|---|---|
| *C01G 5/00* | (2006.01) | |
| *C23C 14/08* | (2006.01) | |
| *C23C 14/34* | (2006.01) | |
| *C23F 1/00* | (2006.01) | |
| *H01L 41/187* | (2006.01) | |
| *H01L 41/047* | (2006.01) | |
| *H01L 41/29* | (2013.01) | |
| *H01L 41/318* | (2013.01) | |

(52) U.S. Cl.
CPC .............. *C23F 1/00* (2013.01); *C23C 14/088* (2013.01); *C23C 14/3414* (2013.01); *H01L 41/0478* (2013.01); *H01L 41/29* (2013.01); *C01P 2006/40* (2013.01); *H01L 41/1876* (2013.01); *H01L 41/318* (2013.01)

(58) Field of Classification Search
None
See application file for complete search history.

(56) References Cited

U.S. PATENT DOCUMENTS

| | | | | |
|---|---|---|---|---|
| 2001/0015448 | A1* | 8/2001 | Kawakubo | H01L 28/55 257/296 |
| 2010/0123175 | A1* | 5/2010 | Kanaya | H01L 28/55 257/295 |
| 2016/0190429 | A1* | 6/2016 | Kijima | H01L 41/0805 310/328 |

FOREIGN PATENT DOCUMENTS

| | | |
|---|---|---|
| JP | 2002-164586 | 6/2002 |
| JP | 2005-108876 | 4/2005 |
| JP | 2011-228178 | 11/2011 |
| JP | 2011-238714 | 11/2011 |
| WO | 2006/087777 | 8/2006 |

OTHER PUBLICATIONS

Chi et. al. Bull. Korean Chem. Soc. 1997, vol. 18, 9, 972-976.*

(Continued)

*Primary Examiner* — Vera Katz

(74) *Attorney, Agent, or Firm* — Wenderoth, Lind & Ponack, L.L.P.

(57) ABSTRACT

To obtain a piezoelectric film having excellent piezoelectric properties. An aspect of the present invention relates to ferroelectric ceramics including a first $Sr(Ti_{1-x}Ru_x)O_3$ film and a PZT film formed on the first $Sr(Ti_{1-x}Ru_x)O_3$ film, wherein the x satisfies a formula 1 below.

$$0.01 \leq x \leq 0.4 \qquad \text{formula 1}$$

3 Claims, 4 Drawing Sheets

(56) References Cited

OTHER PUBLICATIONS

Ohara et. al. Jpn. J. Appl. Phys. vol. 40, 1-3A, 2001 abstract.*
Kuffer et. al. Nature Materials 4, 2005, 378-382.*
Gupta et. al. Materials Research Bull. vol. 31, 12, 1996, 1463-1470.*

* cited by examiner

ELECTRODE, FERROELECTRIC CERAMICS AND MANUFACTURING METHOD THEREOF

BACKGROUND OF THE INVENTION

Field of the Invention

The present invention relates to an electrode, ferroelectric ceramics and a manufacturing method thereof.

Description of a Related Art

A conventional manufacturing method of a Pb(Zr,Ti)O$_3$ (hereinafter, referred to as "PZT") perovskite-type ferroelectric ceramic will be explained.

A SiO$_2$ film having a thickness of 300 nm is formed on a 4-inch Si wafer, and a TiO$_x$ film having a thickness of 5 nm is formed on the SiO$_2$ film. Next, a Pt film having a thickness of 150 nm, oriented in, for example, (111) is formed on the TiO$_x$ film, and a PZT sol-gel solution is applied onto the Pt film by using a spin coater. Spin conditions at this time are such that the wafer is rotated at a rotational speed of 1500 rpm for 30 seconds and is rotated at a rotational speed of 4000 rpm for 10 seconds.

Next, the applied PZT sol-gel solution is heated and held on a hotplate at 250° C. for 30 seconds to thereby be dried, and moisture is removed, and after that, is additionally heated and held for 60 seconds on a hot plate maintained at a high temperature of 500° C. to thereby perform temporary calcination. A PZT amorphous film having a thickness of 150 nm is produced by repeating this for several times.

Subsequently, an annealing treatment is performed on the PZT amorphous film at 700° C. by using a pressurizing-type lamp annealing device (RTA: rapidly thermal anneal) to thereby carry out PZT crystallization. The PZT film thus crystallized is formed of a perovskite structure (refer to, for example, Patent Literature 1).

In the above-described conventional technology, since a Pt film is used as an electrode, there is a problem of becoming costly, and thus an electrode with cost lower than that of a Pt film is required.

[Patent Literature 1] WO 2006/087777

SUMMARY OF THE INVENTION

An aspect of the present invention is to solve the problem of reducing cost of an electrode.

Furthermore, an aspect of the present invention is to solve the problem of obtaining a piezoelectric film having excellent piezoelectric properties.

Hereinafter, various aspects of the present invention will be explained.

[1] An electrode including a Sr(Ti$_{1-x}$Ru$_x$)O$_3$ film, wherein the x satisfies a formula 1 below.

$0.01 \leq x \leq 0.4$  formula 1

[2] The electrode according to [1], wherein the x satisfies a formula 2 below.

$0.05 \leq x \leq 0.2$  formula 2

[3] Ferroelectric ceramics including:
a first Sr(Ti$_{1-x}$Ru$_x$)O$_3$ film; and
a ferroelectric film formed on the first Sr(Ti$_{1-x}$Ru$_x$)O$_3$ film, wherein:
the ferroelectric film is a film having a perovskite or bismuth layered-structure oxide represented by ABO$_3$ or (Bi$_2$O$_2$)$^{2+}$(A$_{m-1}$B$_m$O$_{3m+1}$)$^{2-}$ (where A is at least one selected from the group consisting of Li, Na, K, Rb, Pb, Ca, Sr, Ba, Bi, La and Hf, B is at least one selected from the group consisting of Ru, Fe, Ti, Zr, Nb, Ta, V, W and Mo, and m is a natural number of 5 or less; and
the x satisfies a formula 3 below.

$0.01 \leq x \leq 0.4$ (preferably $0.05 \leq x \leq 0.2$)  formula 3

Note that the ferroelectric film may be a PZT film. In the present specification, a "PZT film" also includes a film of Pb(Zr,Ti)O$_3$ containing an impurity therein, and it is assumed that various impurities can be incorporated as long as the function of the piezoelectric body of a PZT film is not extinguished even when the impurity is incorporated.

[4] The ferroelectric ceramics according to [3], wherein a second Sr(Ti$_{1-x}$Ru$_x$)O$_3$ film is formed on the ferroelectric film, and the x satisfies a formula 3 below.

$0.01 \leq x \leq 0.4$ (preferably $0.05 \leq x \leq 0.2$)  formula 3

[5] The ferroelectric ceramics according to [3] or [4], wherein the first Sr(Ti$_{1-x}$Ru$_x$)O$_3$ film is formed on a ZrO$_2$ film.

[6] The ferroelectric ceramics according to [3] or [4], wherein the first Sr(Ti$_{1-x}$Ru$_x$)O$_3$ film is formed on an electrode film.

[7] The ferroelectric ceramics according to [6], wherein the electrode film includes an oxide or a metal.

[8] The ferroelectric ceramics according to [6] or [7], wherein the electrode film is a Pt film or an Ir film.

[9] The ferroelectric ceramics according to any one of [6] to [8], wherein the electrode film is formed on a Si substrate.

[10] A sputtering target having Sr(Ti$_{1-x}$Ru$_x$)O$_3$, wherein the x satisfies a formula 3 below.

$0.01 \leq x \leq 0.4$ (preferably $0.05 \leq x \leq 0.2$)  formula 3

[11] The sputtering target according to [10], having a sintered body of the Sr(Ti$_{1-x}$Ru$_x$)O$_3$.

[12] A manufacturing method of ferroelectric ceramics including the steps of:
forming a Sr(Ti$_{1-x}$Ru$_x$)O$_3$ film on a Pt film; and forming a ferroelectric film on the Sr(Ti$_{1-x}$Ru$_x$)O$_3$ film, wherein:
the ferroelectric film is a film having a perovskite or bismuth layered-structure oxide represented by ABO$_3$ or (Bi$_2$O$_2$)$^{2+}$(A$_{m-1}$B$_m$O$_{3m+1}$)$^{2-}$ (where A is at least one selected from the group consisting of Li, Na, K, Rb, Pb, Ca, Sr, Ba, Bi, La and Hf, B is at least one selected from the group consisting of Ru, Fe, Ti, Zr, Nb, Ta, V, W and Mo, and m is a natural number of 5 or less); and
the x satisfies a formula 3 below.

$0.01 \leq x \leq 0.4$ (preferably $0.05 \leq x \leq 0.2$)  formula 3

[13] The manufacturing method of ferroelectric ceramics according to [12], wherein, after forming the ferroelectric film, the ferroelectric film is subjected to etching processing.

[14] The manufacturing method of ferroelectric ceramics according to [12] or [13], wherein the Sr(Ti$_{1-x}$Ru$_x$)O$_3$ film is formed by sputtering.

It is possible to obtain a piezoelectric film having excellent piezoelectric properties by applying one aspect of the present invention.

DESCRIPTION OF THE PREFERRED EMBODIMENTS

Hereinafter, embodiments and Examples of the present invention will be explained in detail using the drawings. However, a person skilled in the art would be able to easily understand that the present invention is not limited to the following explanations but forms and details thereof may be variously modified without deviating from the purport and the scope of the present invention. Accordingly, the present invention is not to be construed as being limited to the description of the embodiments and Examples, shown below.

Figure 1:
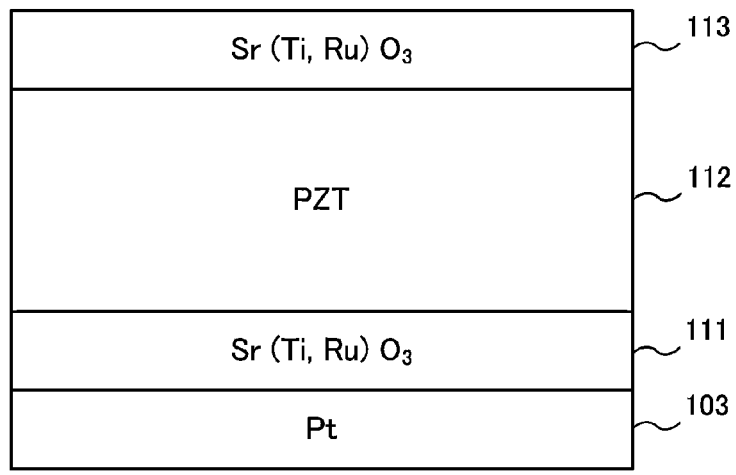
FIG. 1 is a schematic cross-sectional view explaining a manufacturing method of ferroelectric ceramics according to one aspect of the present invention.

FIG. 1 is a schematic cross-sectional view explaining a manufacturing method of ferroelectric ceramics according to one aspect of the present invention.

A substrate (not shown) is prepared. Various kinds of substrates can be used as the substrate, and there can be used, for example, substrates of a single crystal such as a Si single crystal or a sapphire single crystal, substrates of a single crystal with a metal oxide film formed on the surface thereof, substrates with a polysilicon film or a silicide film formed on the surface thereof, and the like. Note that, in the present embodiment, a Si substrate oriented in (100) is used.

Next, a $ZrO_2$ film (not shown) is formed on the Si substrate at a temperature of 550° C. or less (preferably at 500° C.) by an evaporation method. The $ZrO_2$ film is oriented in (200).

After that, a Pt film 103 by epitaxial growth is formed on the $ZrO_2$ film at a temperature of 550° C. or less (preferably at 400° C.) by sputtering. The Pt film 103 is oriented in (200). Note that the Pt film 103 can be functioned as an electrode film. Furthermore, the Pt film 103 may be an electrode film other than a Pt film. The electrode film may be an electrode film formed of, for example, an oxide or metal, or may be an Ir film.

By setting the substrate temperature to be 550° C. or less when forming the $ZrO_2$ film and the Pt film 103 and controlling the growth rate and thermal stress of the film to be low, as described above, it is possible to orient the Pt film in (200) even when forming the Pt film 103 directly on a $ZrO_2$ film without the mixing of $Y_2O_3$.

Next, a first $Sr(Ti_{1-x}Ru_x)O_3$ film 111 is formed on the Pt film 103 by sputtering. Note that the x satisfies a formula 1 below. Furthermore, a sintered body of a $Sr(Ti_{1-x}Ru_x)O_3$ is used as a sputtering target at this time.

However, the x satisfies the formula 1 below.

$$0.01 \leq x \leq 0.4 (\text{preferably } 0.05 \leq x \leq 0.2) \qquad \text{formula 1}$$

Note that the reason why the x in the first $Sr(Ti_{1-x}Ru_x)O_3$ film 111 is 0.4 or less is because, when the x is set to exceed 0.4, the first $Sr(Ti_{1-x}Ru_x)O_3$ film becomes powdery and cannot sufficiently be solidified.

After that, the first $Sr(Ti_{1-x}Ru_x)O_3$ film 111 is crystallized by RTA (Rapid Thermal Anneal) in a pressurized oxygen atmosphere.

The first $Sr(Ti_{1-x}Ru_x)O_3$ film 111 is a film of a complex oxide of strontium, titanium and ruthenium, the complex oxide being a compound having a perovskite structure.

Next, a PZT amorphous film that is short of lead, or a PZT amorphous film of a stoichiometric composition is formed on the first $Sr(Ti_{1-x}Ru_x)O_3$ film 111, and by subjecting the PZT amorphous film to a heat treatment in a pressurized oxygen atmosphere, a PZT film 112 obtained by crystallizing the PZT amorphous film is formed on the first $Sr(Ti_{1-x}Ru_x)O_3$ film 111. Note that the amount of lead in the PZT amorphous film that is short of lead is preferably 80 atom % or more to 95 atom % or less, when the amount of lead of a PZT amorphous film in the case of a stoichiometric composition is defined as 100 atom %.

Subsequently, a second $Sr(Ti_{1-x}Ru_x)O_3$ film 113 is formed on the PZT film 112 by sputtering. Note that the x satisfies the formula 3 below. Furthermore, the conditions of sputtering film formation at this time are the same as those for the first $Sr(Ti_{1-x}Ru_x)O_3$ film 111.

$$0.01 \leq x \leq 0.4 (\text{preferably } 0.05 \leq x \leq 0.2) \qquad \text{formula 3}$$

After that, the second $Sr(Ti_{1-x}Ru_x)O_3$ film 113 is crystallized by RTA in a pressurized oxygen atmosphere. The conditions of TRA at this time are the same as those for the first $Sr(Ti_{1-x}Ru_x)O_3$ film 111.

Then, a prescribed pattern of the PZT film 112 is formed by processing of the PZT film 112 by wet etching. When the PZT film 112 is wet-etched in this way, unnecessary parts of the PZT film 112 can be removed with good peeling properties. This is because second $Sr(Ti_{1-x}Ru_x)O_3$ films 111 and 113 are sandwiched on the upper and lower sides of the PZT film 112.

Note that, in the present embodiment, the PZT film 112 is formed on the first $Sr(Ti_{1-x}Ru_x)O_3$ film 111, but the embodiment is not limited to this. It is also possible to form another ferroelectric film on the first $Sr(Ti_{1-x}Ru_x)O_3$ film 111.

The ferroelectric film is a film having a perovskite or bismuth layered-structure oxide represented by $ABO_3$ or $(Bi_2O_2)^{2+}(A_{m-1}B_mO_{3m+1})^{2-}$ (in the formulae, A is at least one type selected from the group consisting of Li, Na, K, Rb, Pb, Ca, Sr, Ba, Bi, La and Hf, B is at least one type selected from the group consisting of Ru, Fe, Ti, Zr, Nb, Ta, V, W and Mo, and m is a natural number of 5 or less).

According to the present embodiment, since the PZT film 112 as a piezoelectric film is formed between the first $Sr(Ti_{1-x}Ru_x)O_3$ film 111 and the second $Sr(Ti_{1-x}Ru_x)O_3$ film 113, a piezoelectric film having excellent piezoelectric properties can be obtained.

Figure 8:
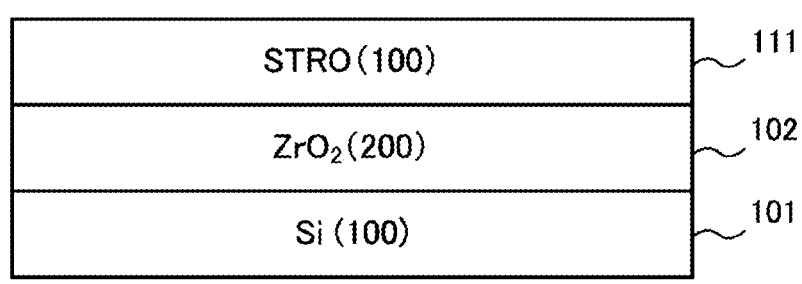
FIG. 8 is a schematic cross-sectional view explaining a manufacturing method of ferroelectric ceramics according to one aspect of the present invention.

Note that, in the present embodiment, a $ZrO_2$ film is formed on a Si substrate, the Pt film 103 is formed on the $ZrO_2$ film, and the Pt film 103 is made to function as an electrode film, but, as shown in FIG. 8, without the formation of the Pt film 103, the $ZrO_2$ film 102 oriented in (200) is formed on the Si substrate 101 oriented in (100), the first $Sr(Ti_{1-x}Ru_x)O_3$ film 111 oriented in (100) is formed on the $ZrO_2$ film 102, a PZT film is formed on the first $Sr(Ti_{1-x}Ru_x)O_3$ film 111, and the second $Sr(Ti_{1-x}Ru_x)O_3$ film is formed on the PZT film, with the result that the first $Sr(Ti_{1-x}Ru_x)O_3$ film 111 can be made to function as an electrode film.

Furthermore, a sputtering target when forming each of the first and second $Sr(Ti_{1-x}Ru_x)O_3$ films 111 and 113 is a sintered body of $Sr(Ti_{1-x}Ru_x)O_3$.

Example 1

Figure 2:
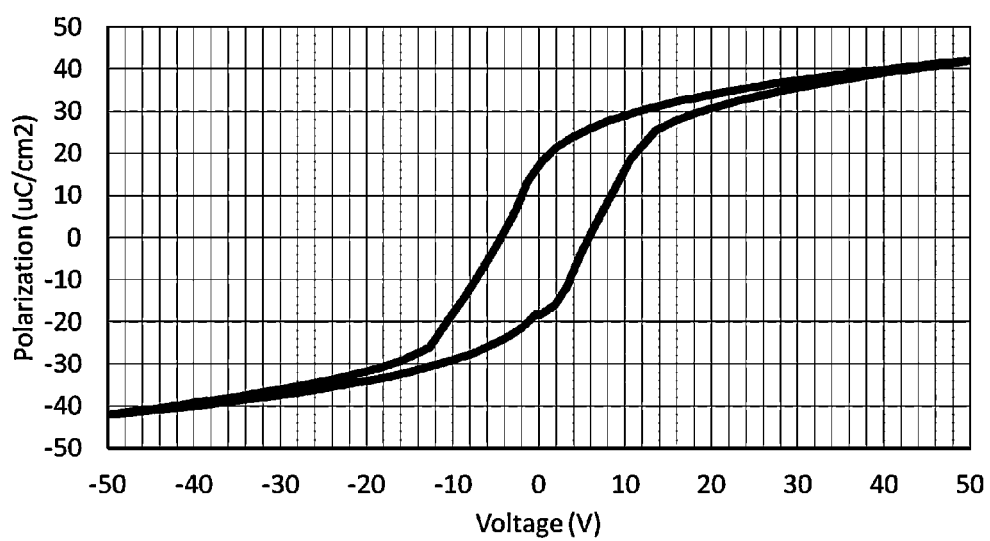
FIG. 2 is a drawing showing hysteresis properties of a PZT film of a sample in Example 1.

FIG. 2 is a drawing showing a result of evaluating hysteresis of a PZT film of a sample 2 in Example 1. In FIG. 2, the vertical axis shows polarization ($\mu C/cm^2$), and the horizontal axis shows an applied voltage (V).

Figure 3A:
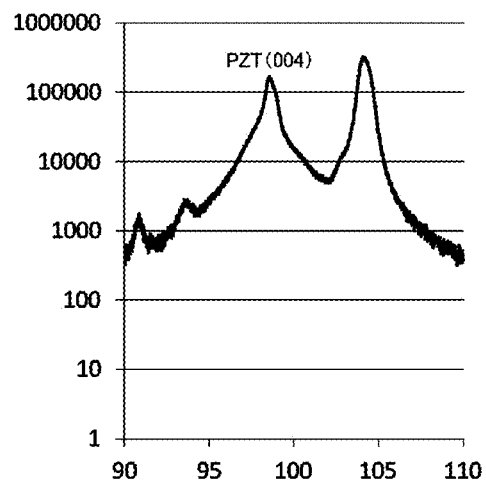
FIG. 3A is an XRD chart of a PZT film of a sample in Example 1.
Figure 3B:
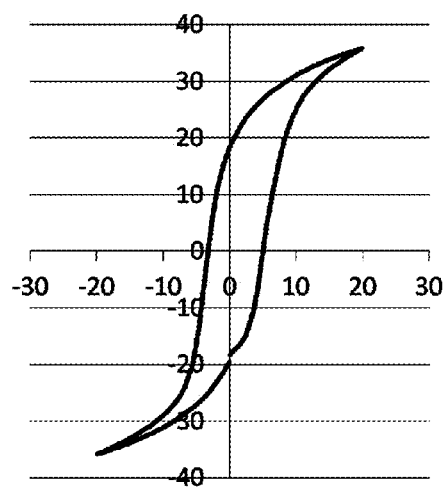
FIG. 3B is a drawing showing hysteresis properties of the PZT film of the sample in Example 1.

FIG. 3A is a chart showing a result of XRD of the PZT film of the sample 2 in Example 1, and FIG. 3B is a drawing showing a result of evaluating hysteresis of the PZT film of the sample 2 in Example 1.

Hereinafter, a production method of samples 1 and 2 in the Example will be explained.

A $ZrO_2$ film oriented in (200) was formed on a Si wafer having a (100) crystal plane by a reactive evaporation method, and a Pt film oriented in (200) was formed on the $ZrO_2$ film by sputtering. Processes up to this process are common to samples 1 and 2.

Next, a first $Sr(Ti_{0.8}Ru_{0.2})O_3$ film was formed on the Pt film of the sample 1 by sputtering. Furthermore, a first $Sr(Ti_{0.95}Ru_{0.05})O_3$ film was formed on the Pt film of the sample 2 by sputtering. Conditions of the sputtering at this time are as shown in Table 1.

TABLE 1

| STRO SPUTTERING CONDITIONS | | |
|---|---|---|
| PROCESS | RF-SPUTTERING | ← |
| TARGET | $Sr(Ti_{0.95}, Ru_{0.05})O_3$ | $Sr(Ti_{0.8}, Ru_{0.2})O_3$ |
| RF POWER | 400 W/13.56 MHz | ← |
| PROCESS PRESSURE | 4 Pa | ← |
| GAS FLOW RATE Ar/O2 (sccm) | 40/0 | 30/10 |
| SUBSTRATE TEMPERATURE | 600° C. | ← |
| PROCESS TIME | 20 sec | ← |
| FILM THICKNESS | 50 nm | ← |

Subsequently, the first $Sr(Ti_{0.8}Ru_{0.2})O_3$ film of the sample 1 and the first $Sr(Ti_{0.95}Ru_{0.05})O_3$ film of the sample 2 were crystallized by RTA in a pressurized oxygen atmosphere. Conditions of the RTA at this time were as follows.

[Conditions of RTA]
Annealing temperature: 600° C.
Introduced gas: oxygen gas
Pressure: 9 kg/cm$^2$
Temperature rising rate: 100° C./sec
Annealing time: 5 minutes Next, a PZT film was formed as follows, on each of the first $Sr(Ti_{0.8}Ru_{0.2})O_3$ film of the sample 1 and the first $Sr(Ti_{0.95}Ru_{0.05})O_3$ film of the sample 2.

As a sol-gel solution for forming the PZT film, there was used an E1 solution having a concentration of 10% by weight, which contains butanol as a solvent and which is obtained by adding lead in an amount of stoichiometric composition without short of lead.

An alkaline alcohol having an amino group, referred to as dimethylamino ethanol, was added to the sol-gel solution at a ratio of E1 sol-gel solution:dimethylamino ethanol=7:3 in a volume ratio, which exhibited strong alkalinity of pH=12.

A PZT amorphous film was formed using the above-described solution by spin coating. MS-A200 manufactured by MIKASA CO., LTD. was used as a spin coater. First, the coater was rotated at 800 rpm for 5 seconds and at 1500 rpm for 10 seconds, then the rotational speed was raised gradually to 3000 rpm in 10 seconds, which was left on a hot plate (AHS-300, a ceramic hot plate manufactured by AS ONE Corporation) at 150° C. for 5 minutes in the air, after that, was left on a hotplate (AHS-300) at 300° C. for 10 minutes also in the air, and subsequently, was cooled to room temperature. The process was repeated plural times to thereby form a PZT amorphous film having an intended thickness of 773 nm on each of the first $Sr(Ti_{0.8}Ru_{0.2})O_3$ film of the sample 1 and the first $Sr(Ti_{0.95}Ru_{0.05})O_3$ film of the sample 2. The product was formed in plural number.

Next, a heat treatment was performed on the above-described PZT amorphous film in a pressurized oxygen atmosphere to thereby form a PZT film obtained by crystallizing the PZT amorphous film, on each of the first $Sr(Ti_{0.8}Ru_{0.2})O_3$ film of the sample 1 and the first $Sr(Ti_{0.95}Ru_{0.05})O_3$ film of the sample 2.

After that, the second $Sr(Ti_{0.8}Ru_{0.2})O_3$ film was formed by sputtering on the crystallized PZT film of the sample, in the same way as that for the first $Sr(Ti_{0.95}Ru_{0.2})O_3$ film. Furthermore, the second $Sr(Ti_{0.95}Ru_{0.05})O_3$ film was formed by sputtering on the crystallized PZT film of the sample 2, in the same way as that for the first $Sr(Ti_{0.95}Ru_{0.05})O_3$ film. Subsequently, the second $Sr(Ti_{0.8}Ru_{0.2})O_3$ film and the second $Sr(Ti_{0.95}Ru_{0.05})O_3$ film were crystallized by RTA in a pressurized oxygen atmosphere. Conditions of the RTA at this time were the same as those for the first $Sr(Ti_{0.8}Ru_{0.2})O_3$ film.

The sample 1 produced in this way was second $Sr(Ti_{0.8}Ru_{0.2})O_3$/PZT/first $Sr(Ti_{0.8}Ru_{0.2})O_3$/Pt/$ZrO_2$/Si wafer, and the sample 2 was second $Sr(Ti_{0.95}Ru_{0.05})O_3$/PZT/first $Sr(Ti_{0.95}Ru_{0.05})O_3$/Pt/$ZrO_2$/Si wafer.

Hysteresis properties of the PZT film of the sample 2 were evaluated (refer to FIG. 2). It was confirmed that the PZT film formed between the first $Sr(Ti_{0.9}Ru_{0.2})O_3$ film and the second $Sr(Ti_{0.9}Ru_{0.2})O_3$ film gave a largely spaced hysteresis curve and had excellent piezoelectric properties.

It was confirmed that the (004) peak intensity of PZT film was strong from an XRD chart shown in FIG. 3A. As shown in FIG. 3B, it was confirmed that the PZT film gave a largely spaced hysteresis curve and had excellent piezoelectric properties.

Measurements results of sheet resistance value of each of the first $Sr(Ti_{0.8}Ru_{0.2})O_3$ film and the first $Sr(Ti_{0.95}Ru_{0.05})$ film having a thickness of 300 nm of samples 1 and 2 of the Example in five points by a four-terminal method are shown in Table 2. From Table 2, it was confirmed that the sheet resistance of each of the first $Sr(Ti_{0.8}Ru_{0.2})O_3$ film and the first $Sr(Ti_{0.95}Ru_{0.05})$ film was sufficiently low. In other words, it was confirmed that each of the first $Sr(Ti_{0.8}Ru_{0.2})O_3$ film and the first $Sr(Ti_{0.95}Ru_{0.05})$ film had low resistance to the extent that each of the film was able to function as an electrode.

TABLE 2

| SHEET RESISTANCE | | |
|---|---|---|
| Point | $Sr(Ti_{0.95}, Ru_{0.05})O_3$ | $Sr(Ti_{0.8}, Ru_{0.2})O_3$ |
| 1 | 0.595 Ω/□ | 0.626 Ω/□ |
| 2 | 0.731 Ω/□ | 0.653 Ω/□ |
| 3 | 0.722 Ω/□ | 0.583 Ω/□ |
| 4 | 0.801 Ω/□ | 0.600 Ω/□ |
| 5 | 0.733 Ω/□ | 0.596 Ω/□ |

Comparative Example 1

Comparative Example 1 to be compared with the Example 1 will be explained.

Figure 4:
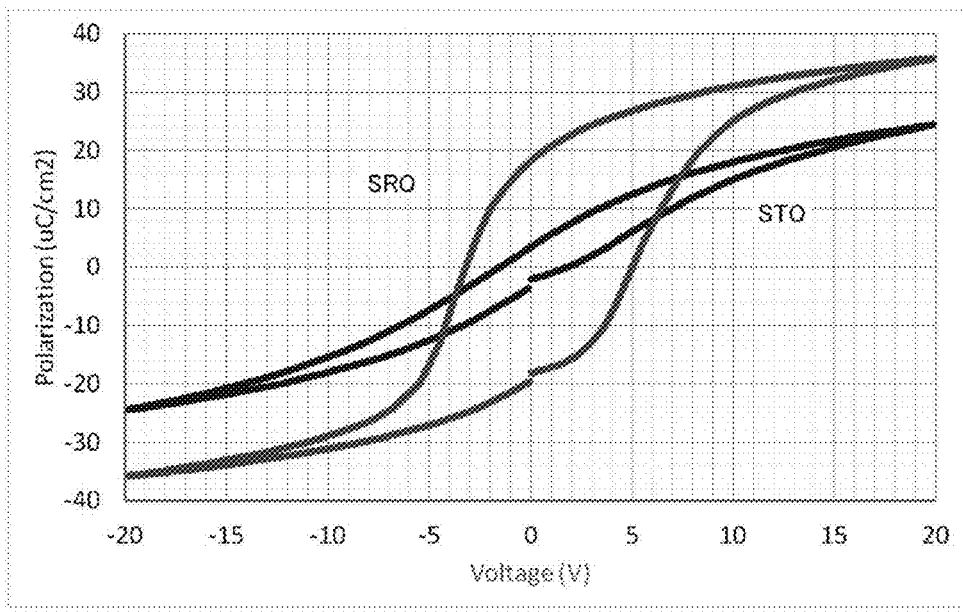
FIG. 4 is a drawing showing hysteresis properties of PZT films that are samples 1 and 2 in Comparative Example 1.

FIG. 4 is a drawing showing hysteresis properties of PZT films of samples 1 and 2 in Comparative Example 1. In FIG. 4, the vertical axis shows polarization ($\mu C/cm^2$), and the horizontal axis shows an applied voltage (V).

Figure 5:
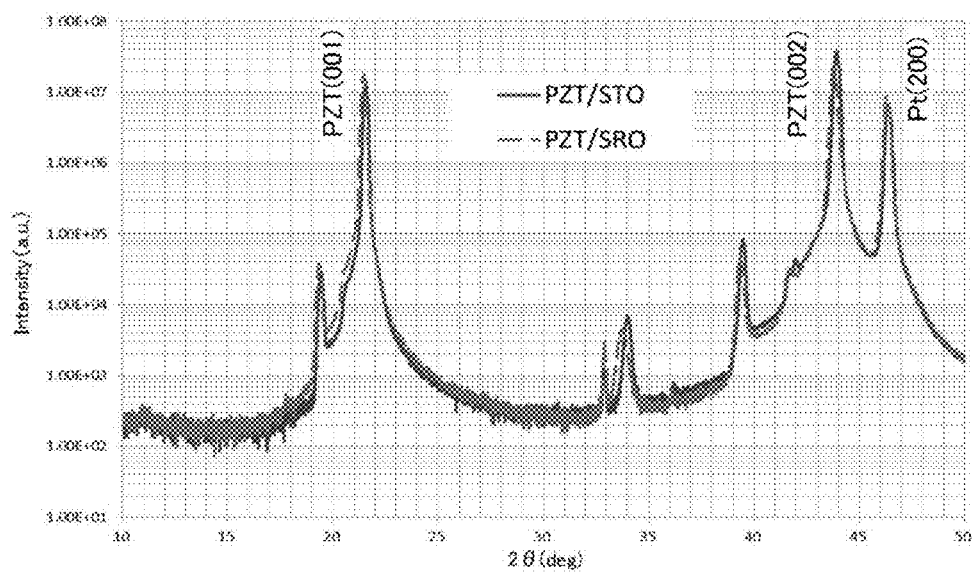
FIG. 5 is an XRD chart of PZT films that are samples 1 and 2 in Comparative Example 1.

FIG. 5 is a chart showing results of XRD of PZT films of samples 1 and 2 in Comparative Example 1. In FIG. 5, the vertical axis shows intensity and the horizontal axis shows 2θ.

Figure 6:
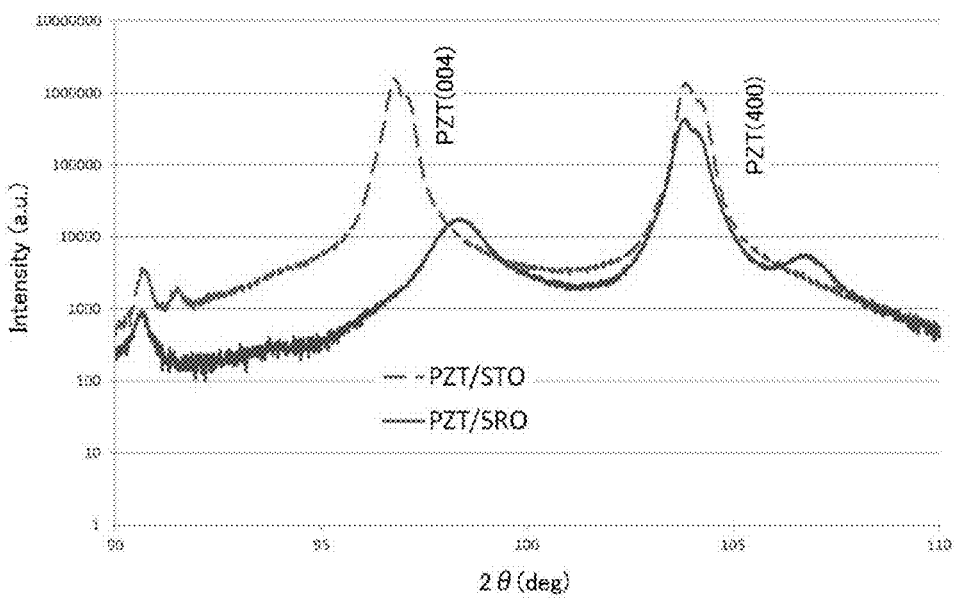
FIG. 6 is an XRD chart of PZT films that are samples 1 and 2 in Comparative Example 1.

FIG. 6 is a chart showing results of XRD of PZT films of samples 1 and 2 in Comparative Example 1.

Hereinafter, production methods of samples 1, 2 in Comparative Example 1 will be explained.

The sample 1 was produced in the same way as the sample 1 in Example 1, except for replacing each of the first and second $Sr(Ti_{0.8}Ru_{0.2})O_3$ films (STRO) of the sample 1 in Example 1 with first and second $SrTiO_3$ films (STO). Sputtering film formation conditions and RTA conditions after the film formation for each of the first and second $SrTiO_3$ films are as follows.

[Sputtering Film Formation Conditions]
Film formation pressure: 4 Pa
Film formation substrate temperature: ordinary temperature
  Gas in film formation: Ar
  Ar flow rate: 30 sccm
  RF output: 300 W (13.56 MHz power source)
  Film formation time: 6 minutes (film thickness 50 nm)
  Target: $SrTiO_3$ sintered body
[RTA Conditions]
  Annealing temperature: 600° C.
  Introduced gas: oxygen gas
  Pressure: 9 kg/cm$^2$
  Temperature rising rate: 100° C./sec
  Annealing time: 5 minutes The sample 2 was produced in the same way as the sample in Example 1, except for replacing each of the first and second $Sr(Ti_{0.8}Ru_{0.2})O_3$ films (STRO) of the sample in Example 1 with the first and second $SrRuO_3$ films (SRO). Sputtering film formation conditions and RTA conditions after the film formation for each of the first and second $SrRuO_3$ films are as follows.

[Sputtering Film Formation Conditions]
Film formation pressure: 4 Pa
Film formation substrate temperature: ordinary temperature
  Gas in film formation: Ar
  Ar flow rate: 30 sccm
  RF output: 300 W (13.56 MHz power source)
  Film formation time: 6 minutes (film thickness 50 nm)
  Target: $SrRuO_3$ sintered body
[RTA Conditions]
  Annealing temperature: 600° C.
  Introduced gas: oxygen gas
  Pressure: 9 kg/cm$^2$
  Temperature rising rate: 100° C./sec
  Annealing time: 5 minutes Hysteresis properties of PZT films of the above-described samples 1 and 2 were evaluated (refer to FIG. 4). It is found that the PZT film of the sample 1 using STO has a hysteresis curve that is less likely to be spaced, whereas the PZT film of the sample 2 using SRO has a hysteresis curve that is easily spaced. Note that the PZT film of the sample 1 using STO has properties of small piezoelectricity and a large breakdown voltage (or a small leak current). In addition, the PZT film of the sample 2 using SRO has properties of large piezoelectricity and a small breakdown voltage (or a large leak current).

From the XRD chart shown in FIG. 5, the crystallinity of each of the $SrTiO_3$ film of the sample 1 and $SrRuO_3$ film of the sample 2 was confirmed.

From the XRD chart shown in FIG. 6, it was confirmed that the (004) peak intensity of the PZT film of the sample 2 using SRO was weak, whereas the (004) peak intensity of the PZT film of the sample 1 using STO was strong. Furthermore, since the difference between 2θ of the (400) peak and the 2θ of the (004) peak is the amount of polarization, it was confirmed that the amount of polarization of the sample 2 using SRO was small, whereas the amount of polarization of the sample 1 using STO was large.

It is found that, in the Example, excellent properties of samples 1 and 2 in Comparative Example 1 can be obtained. Specifically, in the Example, it is possible to space largely the hysteresis curve of the PZT film (refer to FIG. 2), and to intensify the (004) peak intensity of the PZT film (refer to FIG. 4A). The PZT film according to the Example has properties of large piezoelectricity, a large breakdown voltage and being easily c-axis oriented. Accordingly, excellent piezoelectric properties can be obtained.

Furthermore, in the Example, the breakdown voltage of the PZT film can be made large.

Example 2

Figure 7A:
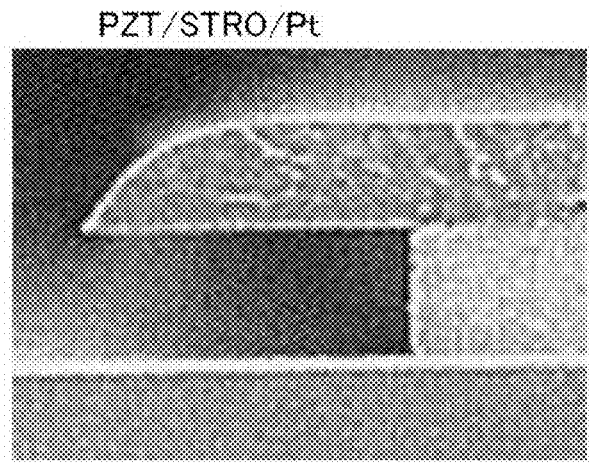
FIG. 7A is a cross-sectional view of a sample after wet-etching and peeling a PZT film of a sample the same as that in Example 1.
Figure 7B:
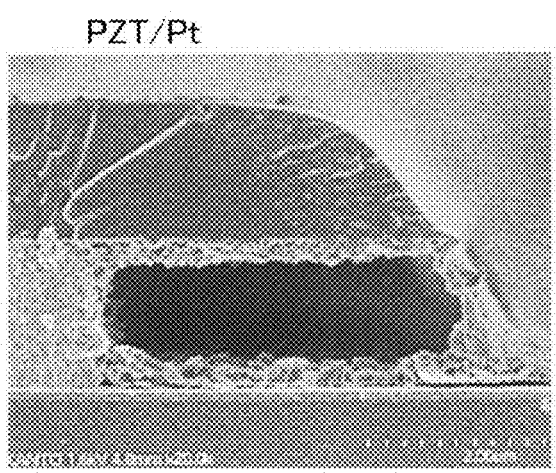
FIG. 7B is a cross-sectional view of a sample after wet-etching and peeling the PZT film of the sample in Comparative Example 2.

FIG. 7A is a cross-sectional view of a sample after the following wet-etching of and the peeling of the PZT film of the same sample (PZT/$Sr(Ti_{0.8}Ru_{0.2})O_3$(STRO)/Pt) as the sample 1 in Example 1, and FIG. 7B is a cross-sectional view of a sample after the following wet-etching of and the peeling of the PZT film of the sample (PZT/Pt) in Comparative Example 2.

<Wet Etching Conditions>
  10 w %-HCl+0.1 w %-HF aqueous solution
  wet-etching of PZT capacitor obtained by coating resist having a thickness of 1 μm
  Use amount of etchant of 50 ml, 35° C.
  Approximately 100 seconds at 700 rpm of ACT-300AII
  SEM observation and evaluation after washing with water As shown in FIG. 7B, when the $Sr(Ti_{0.8}Ru_{0.2})O_3$ film (STRO) is not sandwiched on and under a PZT film, the PZT film remains at the interface with the Pt film even when wet-etching is performed. In contrast to this, as shown in FIG. 7A, when the $Sr(Ti_{0.8}Ru_{0.2})O_3$ film (STRO) is sandwiched on and under a PZT film, the PZT film is peeled off completely by wet etching without remaining at the interface. From this, it can be expected that the PZT film obtained by sandwiching the $Sr(Ti_{0.8}Ru_{0.2})O_3$ film (STRO) on and under the PZT film has excellent properties of the interface as a capacitor.

DESCRIPTION OF REFERENCE SYMBOLS

101 Si substrate
102 $ZrO_2$ film
103 Pt film
111 first $Sr(Ti_{1-x}Ru_x)O_3$ film
112 PZT film
113 second $Sr(Ti_{1-x}Ru_x)O_3$ film

The invention claimed is:
1. Ferroelectric ceramics comprising:
a first $Sr(Ti_{1-x}Ru_x)O_3$ film; and a PZT film directly formed on said first $Sr(Ti_{1-x}Ru_x)O_3$ film, wherein:

said first $Sr(Ti_{1-x}Ru_x)O_3$ film is directly formed on a $ZrO_2$ film; and said x satisfies a formula 1 below, $$0.01 \leq x \leq 0.4 \quad \text{formula 1.}$$

2. The ferroelectric ceramics according to claim 1, wherein a second $Sr(Ti_{1-x}Ru_x)O_3$ film is formed on said PZT film, and said x satisfies a formula 3 below, $$0.01 \leq x \leq 0.4 \quad \text{formula 3.}$$

3. The ferroelectric ceramics according to claim 1, wherein said $ZrO_2$ film is formed on a Si substrate.

\* \* \* \* \*